(12) United States Patent
Kodaira et al.

(10) Patent No.: US 7,262,088 B2
(45) Date of Patent: Aug. 28, 2007

(54) THIN FILM DEVICE SUPPLY BODY, METHOD OF FABRICATING THIN FILM DEVICE, METHOD OF TRANSFER, METHOD OF FABRICATING SEMICONDUCTOR DEVICE, AND ELECTRONIC EQUIPMENT

(75) Inventors: Taimei Kodaira, Chino (JP); Sumio Utsunomiya, Suwa (JP)

(73) Assignee: Seiko Epson Corporation, Tokyo (JP)

(*) Notice: Subject to any disclaimer, the term of this patent is extended or adjusted under 35 U.S.C. 154(b) by 145 days.

(21) Appl. No.: 11/072,500

(22) Filed: Mar. 7, 2005

(65) Prior Publication Data

US 2005/0202619 A1 Sep. 15, 2005

(30) Foreign Application Priority Data

| Mar. 10, 2004 | (JP) | ............................. 2004-067556 |
| Jun. 29, 2004 | (JP) | ............................. 2004-191359 |
| Dec. 17, 2004 | (JP) | ............................. 2004-366725 |

(51) Int. Cl.
*H01L 21/336* (2006.01)
*H01L 21/8234* (2006.01)

(52) U.S. Cl. .............................. 438/197; 257/E21.122

(58) Field of Classification Search ................ 438/197, 438/455, 458, 459, 464; 257/E21.122
See application file for complete search history.

(56) References Cited

U.S. PATENT DOCUMENTS 6,372,608 B1  4/2002  Shimoda et al.

| 6,521,511 | B1 | 2/2003 | Inoue et al. |
| 6,645,830 | B2 | 11/2003 | Shimoda et al. |
| 6,815,259 | B2* | 11/2004 | Ninomiya et al. .......... 438/125 |
| 7,122,445 | B2* | 10/2006 | Takayama et al. .......... 438/458 |
| 2003/0022403 | A1 | 1/2003 | Shimoda et al. |
| 2003/0209713 | A1 | 11/2003 | Kimura et al. |
| 2004/0080032 | A1 | 4/2004 | Kimura et al. |
| 2004/0239827 | A1* | 12/2004 | Yamazaki et al. ............. 349/45 |

FOREIGN PATENT DOCUMENTS

| JP | 10-125929 | 5/1998 |
| JP | 10-125930 | 5/1998 |
| JP | 10-125931 | 5/1998 |
| JP | 11-026733 | 1/1999 |
| JP | 11-243209 | 9/1999 |
| JP | 2000-133809 | 5/2000 |
| JP | 2000-235348 | 8/2000 |

(Continued)

*Primary Examiner*—Phuc T. Dang
(74) *Attorney, Agent, or Firm*—Oliff & Berridge, PLC

(57) ABSTRACT

A technique is described in which a layer to be transferred is easily peeled and transferred to a transferred body that is pliable or flexible. Also, a method of fabricating a semiconductor device using these peeling and transfer techniques, and electronic equipment fabricated with the semiconductor device is described. A transfer method in which a layer to be transferred formed on a substrate is transferred to a transfer body that is pliable or flexible includes the first step of forming a layer to be transferred on a substrate; the second step of bonding the layer to be transferred formed on the substrate to a transfer body that is pliable or flexible fixed on a fixture; and the third step of peeling the layer to be transferred from the substrate and transferring the layer to be transferred to the transfer body.

21 Claims, 8 Drawing Sheets

FOREIGN PATENT DOCUMENTS

| | | |
|---|---|---|
| JP | 2001-051296 | 2/2001 |
| JP | 2001-189460 | 7/2001 |
| JP | 2002-217390 | 8/2002 |
| JP | 2002-217391 | 8/2002 |
| JP | 2003-031778 | 1/2003 |
| JP | 2003-297974 | 10/2003 |
| JP | 2003-298029 | 10/2003 |

* cited by examiner

THIN FILM DEVICE SUPPLY BODY, METHOD OF FABRICATING THIN FILM DEVICE, METHOD OF TRANSFER, METHOD OF FABRICATING SEMICONDUCTOR DEVICE, AND ELECTRONIC EQUIPMENT

RELATED APPLICATION INFORMATION

This application is related to and claims priority to Japanese Application No. JP2004-067556, filed Mar. 10, 2004, whose contents are expressly incorporated herein by reference.

TECHNICAL FIELD

Aspects of the present invention relate to a transfer technique of a thin film element, and in detail to a transfer method by which peeling and transferring can readily be conducted even though a transfer body is pliable or flexible, a method of fabricating a semiconductor device, and electronic equipment.

BACKGROUND

Recently, with respect to fabrication of thin film devices provided with thin film transistors (TFTs), thin film diodes (TFDs), etc., techniques have been examined in which a thin film device that is lightweight, excellent in shock resistance and is flexible is fabricated by transferring a thin film element, for example, to a flexible substrate that has flexibility from an original fabrication substrate, in which the thin film element is fabricated.

For example, the applicant has developed a method for transferring a thin film element fabricated on an original fabrication substrate to a flexible substrate that serves as a substrate to be transferred, and for which an application has been applied (Japanese Unexamined Patent Application 10-125931). In the method, a thin film element is fabricated on the original fabrication substrate with a peeling layer. Then, it is adhesively bonded on a substrate to be transferred and irradiated with light. As a result, a separation occurs to peel off the original fabrication substrate from the thin film element.

The applicant also has developed a transfer method in which a thin film element is transferred to a temporary transfer substrate (the first transfer body) as the first transfer and then transferred to a second transfer substrate (the second transfer body) as the second transfer. Patents have been applied for relating to this method (Japanese Unexamined Patents 11-26733 and 2001-189460).

With these transfer methods, flexible thin film devices can be fabricated by the following manners: a thin film element that requires high temperature processes and high processing accuracy in fabrications is fabricated on an original fabrication substrate that is excellent in heat resistance and shape stability, and is suitable for fabricating the thin film element; and then the thin film element is transferred on a substrate, for example, such as a resin substrate that is lightweight and is flexible.

However, the flexible thin film device fabricated by using conventional transfer techniques as mentioned above has a disadvantage in that handling is difficult due to an unstable shape while the flexible thin film device is lightweight and flexible. That is, the same method for handling conventional glasses or silicon wafers easily causes mistakes of dropping, etc., in holding or transferring a substrate due to the pliability of the substrates. Particularly, in a case where a thin film device is fabricated in large quantity that is divided into a comparatively small area of approximately from several square millimeters to several square centimeters, it is very difficult to handle each thin film device individually and to conduct inspection or mounting processes promptly.

In addition, transferring a layer to be transferred to a transfer body that is soft (like film) makes a peeling operation difficult. Even if a transfer body that is hard is used as a temporary transfer substrate (the first transfer body), a problem still arises in which the first transfer body is hardly detached from the second transfer body (to which a layer to be transferred is bonded if a substrate to be transferred (the second transfer body) to which the transfer is finally conducted) is composed of a material that has pliability or flexibility such as film, etc.

Also, even if the first transfer body is composed of a material that can be removed by etching etc., for example, a problem arises in which material selection is complicated.

DISCLOSURE OF THE INVENTION

Figure 1:
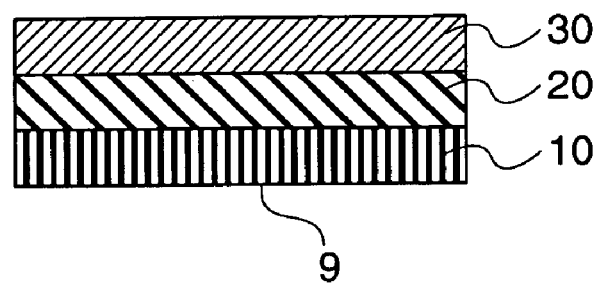
FIG. 1 is a sectional view of an illustrative fabrication process to explain a configuration of a first embodiment of the present invention.

Aspects of the present invention relate to fabrication of a thin film device having layers that may be transferred.

It is noted that various connections are set forth between elements in the following description. It is noted that these connections in general and, unless specified otherwise, may be direct or indirect and that this specification is not intended to be limiting in this respect.

Overview of Aspects of the Present Invention

The following provides a general overview of aspects of the present invention. Aspects of the present invention aim to provide a thin film device supply body by which handling in a fabrication and a shipment is eased, and a method of fabricating thereof.

In addition, aspects of the present invention further aim to provide a technique in which a layer to be transferred is more easily peeled and transferred to a transferred body that has pliability or flexibility.

Also, aspects of the present invention aim to provide a method of fabricating a semiconductor device using these peeling and transfer techniques, and electronic equipment fabricated with the semiconductor device.

In order to achieve at least one of the above-mentioned aims, a thin film device supply body of a first aspect of the present invention is constructed in which a thin film device is fixed on a supporting substrate with a temporary fixing adhesive layer. With this construction, the thin film device can indirectly be handled with the supporting substrate on which the thin film device is fixed.

Here, examples of the supporting substrate include substrates that are hard and excellent in shape stability such as glass, quartz, silicon wafer, etc. These substrates are very generally used in fabricating processes of semiconductors and liquid crystal displays and very easy to handle.

A peeling layer may be formed on the supporting substrate. The supporting substrate may also be a substrate that is transparent to light. Accordingly, through the supporting substrate, light energy can be applied by which a separation occurs in the peeling layer or the temporary fixing adhesive layer or adhesive strength is eliminated (or diminished).

The thin film device preferably includes a construction in which a thin film element layer is provided on a flexible substrate that has flexibility. Accordingly, the thin film device that has flexibility is supported by the supporting substrate, so that a thin film (thin film device) can easily be handled.

The temporary fixing adhesive layer includes functions for temporarily fixing the thin film device to the supporting substrate, and for removing the thin film device if needed. A property of the adhesive layer may be one that demonstrates adhesive strength after curing precursors in liquid or paste by means of thermal curing or light curing or the like, and one that fixes the thin film device to the supporting substrate with tack strength such as adhesive sheet.

In addition, the thin film device supply body includes a construction in which the thin film device is fixed with the peeling layer and the temporary fixing adhesive layer both of which are formed on the supporting substrate.

With this construction, even if removing the thin film device from the supporting substrate at the temporary fixing adhesive layer is difficult due to difficulties in controlling adhesive strength of the temporary fixing layer, the peeling layer also can be used for removing the thin film device, whereby the thin film device can easily be peeled. Accordingly, a selection range of materials can be widened that are available for the temporary fixing adhesive layer. As mentioned above, the thin film device can be obtained that has a construction in which the flexible thin film element layer is provided on the flexible substrate.

In addition, a method of fabricating a thin film device supply body in which the thin film device is provided on a supporting substrate so as to be able to be peeled and transferred of a second aspect of the present invention may include the following steps: a step of fixing a temporary fixing substrate on a thin film element layer fabricated on a surface of an original fabrication substrate with a first temporary fixing adhesive layer; a step of removing the original fabrication substrate from the thin film element layer; a step of bonding a flexible substrate on a face of the thin film element layer with a permanent adhesive layer, the original fabrication substrate being removed from the face; a step of fixing the supporting substrate on a face of the flexible substrate with a second temporary fixing adhesive layer, the face being opposite to the face on which the thin film element is bonded; and a step of removing the temporary fixing substrate from the thin film element.

In the step of removing the original fabrication substrate from the thin film element layer, the following steps are preferably included: a step of using a substrate that has light transparency for the original fabrication substrate; and a step of irradiating light to a peeling layer formed on the substrate in advance from a back face side of the substrate, so that an interfacial separation and/or an intra-layer separation occur in the peeling layer. Also, the step may include a step of grinding and/or etching the original fabrication substrate.

The step of removing the temporary fixing substrate from the thin film element preferably includes a step of performing light irradiation or heating of the first temporary fixing adhesive layer so as to significantly diminish or eliminate the adhesive strength of the first temporary fixing adhesive layer. The step also may include a step of performing light irradiation to the peeling layer formed on the temporary fixing substrate in advance, so that an interfacial separation and/or an intra-layer separation occur in the peeling layer. In addition, the step may include a step of dissolving the first temporary fixing adhesive layer in a solvent.

A substrate that has light transparency such as glass or quartz (quartz glass) is further preferred for the temporary fixing substrate.

In the above-mentioned aspects of the present invention, each peeling layer is preferably composed of a material in which an ablation occurs due to loss or reduction of inter-atomic or intermolecular bonding force with irradiation of laser beams, etc.

The method of fabricating a thin film device supply body further includes a step of dividing the thin film element layer into a plurality of regions after fixing the thin film element layer to any of the supporting substrate, the temporary fixing substrate and the original fabrication substrate.

The step of dividing the thin film element layer into the plurality of regions preferably includes a step of forming a groove at a boundary of the plurality of regions of the thin film element layer, and a step of dividing the flexible substrate at the boundary of the plurality of regions.

The width of a region to be processed, for dividing the flexible substrate at the boundary of the plurality of regions, of the flexible substrate is preferably smaller than the width of a groove formed at a boundary of regions of a plurality of thin film elements or thin film circuits of the thin film element layer.

Electronic equipment of a third aspect of the present invention includes the thin film device supplied from the above-mentioned thin film device supply body.

In addition, in order to solve the above-mentioned problems, a transfer method in which a layer to be transferred formed on a substrate is transferred to a transfer body that is pliable or flexible of a fourth aspect of the present invention includes the first step of forming a layer to be transferred on the substrate; the second step of bonding the layer to be transferred formed on the substrate to a transfer body having pliability or flexibility fixed on a fixture; and the third step of peeling the layer to be transferred from the substrate and transferring the layer to be transferred to the transfer body.

Accordingly, by fixing the transfer body that is pliable or flexible to the fixture, the substrate can readily separated from the transfer body on which the layer to be transferred is bonded, because an uniform force can be applied to the substrate and the transfer body when the two are separated. The transfer method of the layer to be transferred is used for, for example, fabricating semiconductor devices, a method of fabricating electro-optical devices of sheet shape, a method of fabricating electronic equipment, etc.

A transfer method in which a layer to be transferred formed on a substrate is transferred to a transfer body that has pliability or flexibility of a fifth aspect of the present invention includes the following steps: the first step of forming a layer to be transferred on a substrate; the second step of bonding the layer to be transferred to a first transfer body; the third step of peeling the layer to be transferred from the substrate and transferring the layer to be transferred to the first transfer body; the fourth step of bonding the layer to be transferred that has been transferred on the first transfer body to a second transfer body having pliability or flexibility fixed on a fixture; and the fifth step of peeling the layer to be transferred from the first transfer body and transferring the layer to be transferred to the second transfer body.

Accordingly, in a case where the transfer is performed two times, the first transfer body can be separated from the second transfer body on which the layer to be transferred is bonded by fixing the second transfer body to the fixture, even if the second transfer body to which the transfer is finally (the second time) conducted is pliable or flexible.

A transfer method in which a layer to be transferred formed on a substrate is transferred to a transfer body that is pliable or flexible of a sixth aspect of the present invention includes the following steps: the first step of forming the layer to be transferred on the substrate; the second step of bonding the substrate to a first transfer body having pliability or flexibility fixed on a fixture with the layer to be transferred; the third step of peeling the layer to be transferred from the substrate and transferring the layer to be transferred to the first transfer body; the fourth step of bonding the layer to be transferred that has been transferred on the first transfer body to a second transfer body having pliability or flexibility fixed on a fixture; and the fifth step of peeling the layer to be transferred from the first transfer body and transferring the layer to be transferred to the second transfer body.

Accordingly, the layer to be transferred can readily be transferred by fixing the fixture to both of the first transfer body and the second transfer body, even if both of the first transfer body and the second transfer body are pliable or flexible. Here, the layer to be transferred may be temporarily transferred to the first transfer body, and the second transfer body is the final transfer body.

An auxiliary substrate is an illustrative example of the fixture.

A thin film device such as a thin film transistor, etc is an illustrative example of the layer to be transferred.

A method of fabricating a semiconductor device of a seventh aspect of the present invention utilizes the transfer method. Accordingly, peeling and transferring can readily be conducted by means of the transfer method. Thus, productivity of semiconductor devices can be improved. As the result, price of semiconductor device can be reduced.

Electronic equipment of an eighth aspect of the present invention includes the semiconductor device obtained by using the above-mentioned method of fabricating. This makes it possible to provide electronic equipment with low price.

DESCRIPTION OF PREFERRED EMBODIMENTS

In a first embodiment of the present invention, a thin film element layer on which a thin film transistor (TFT) circuit etc., is formed by a peeling and transfer method is transferred to a flexible substrate in a fabrication process of electronic equipment such as an electro-optical device using the flexible substrate. In this case, a flexure of a flexible substrate in a process is avoided by bonding a supporting substrate (or a fixture) that has high mechanical strength to support the flexible substrate difficult to handle, whereby accuracy in peeling and transferring is increased and handling of peeled thin film is eased.

First Embodiment

FIG. 1 shows a thin film device supply body according to a first embodiment of the present invention. As shown in the figure, in the thin film device supply body, a thin film device 30 is formed on one surface (the upper surface) of a supporting substrate 10 with a temporary fixing adhesive layer 20.

The supporting substrate 10 stably supports the thin film device. Glass such as soda glass, heat resistant glass such as Corning 7059 (product name), Nippon Electric Glass OA-2 (product name), etc., or silicon wafer etc., can be used for the supporting substrate 10 in addition to quartz glass. These substrates are hard and have excellent characteristics in shape stability.

The supporting substrate 10 is preferably a substrate that has light transparency in order to supply light energy (or heat) to the temporary fixing adhesive layer 20 from a back face 9 of the supporting substrate 10.

The temporary fixing adhesive layer 20 preferably has a characteristic in that adhesive strength is significantly diminished or lost by light irradiation or heating.

As a property of the temporary fixing adhesive layer 20, one that exhibits adhesive strength after curing a precursor in liquid or paste by means of heat curing, light curing, etc., can be used. An adhesive sheet that fixes a thin film device to the supporting substrate with tack strength may also be used.

The temporary fixing adhesive layer 20 is formed for various purposes. For example, the temporary fixing adhesive layer 20 serves at least one function such as the function of a protective layer for physically or chemically protecting a thin film element (or thin film element layer) 35, which will be described later, during fabrication or use, a conductive layer, a shading layer or a reflection layer to an irradiation light 70, and a barrier layer to prevent components from migrating to or from the thin film element 35.

Examples of the thin film device 30 include a thin film circuit or thin film device that is composed of thin film transistors (TFTs), diodes, emissive elements, light elements, various kinds of detecting elements, capacitors, resistors, inductors, wirings, electrodes, insulators, etc., and demonstrates a fixed function, and the aforementioned thin film element and the like.

Providing such configuration, the thin film device 30 can be handled indirectly with the supporting substrate 10 that has a desired physical and mechanical strength.

The thin film device 30 is bonded to a body to be transferred (a substrate to be transferred), which is not shown, with a permanent adhesive in the condition where the thin film device 30 is laid on the supporting substrate 10. Then, the thin film device 30 is peeled from the supporting substrate 10 by losing the adhesive strength of the temporary fixing adhesive layer 20 with laser light irradiation, thereby enabling the thin film device 30 to be transferred (peeled and transferred) to the body to be transferred.

Second Embodiment

Figure 2:
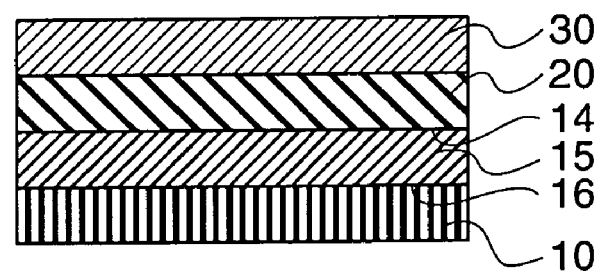
FIG. 2 is a sectional view of an illustrative fabrication process to explain a configuration of the embodiment of the present invention.

FIG. 2 shows a second embodiment of the present invention. In the figure, portions corresponding to those in FIG. 1 are given the same numerals and the explanation thereof is omitted.

In the thin film device supply body of the embodiment, the supporting substrate 10 includes a first peeling layer 15. The thin film device 30 is formed on the upper surface of the peeling layer 15 (the surface that is not touched to the supporting substrate 10) with the temporary fixing adhesive layer 20. That is, the peeling layer 15 and the temporary fixing adhesive layer 20 are sandwiched between the supporting substrate 10 and the thin film device 30. As described later, an amorphous silicon layer, etc., can be used as the peeling layer 15. In the peeling layer 15, for example, the interatomic or intermolecular bonding force is lost by applying energy with laser light. As a result, peeling (destruction) occurs in the peeling layer 15, at an interface 16 of the peeling layer 15 and the supporting substrate 10, and an interface 14 of the peeling layer 15 and the temporary fixing adhesive layer 20, etc.

Where the peeling layer 15 is sandwiched between the supporting substrate 10 and the thin film device 30 in addition to the temporary fixing adhesive layer 20, if removing (peeling and transferring) the thin film device from the supporting substrate 10 at the temporary fixing adhesive layer 20 is difficult due to difficulties in controlling the adhesive strength of the temporary fixing adhesive layer 20, the peeling layer 15 also can be used for removing the thin film device, whereby the thin film device can easily be transferred.

Third Embodiment

Figure 3:
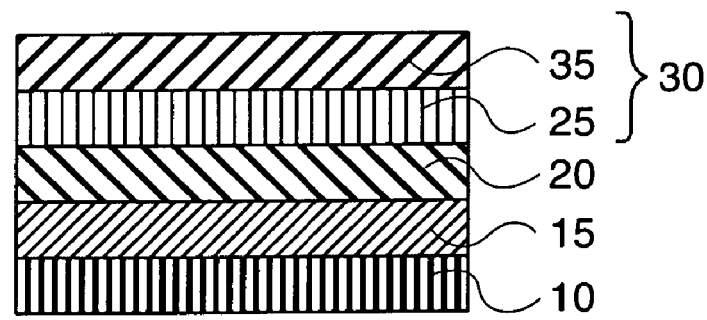
FIG. 3 is a sectional view of an illustrative fabrication process to explain a configuration of the embodiment of the present invention.

FIG. 3 shows a third embodiment of the present invention. In the figure, portions corresponding to those in FIG. 1 are given the same numerals and the explanation thereof is omitted.

In the thin film device supply body of the embodiment, the thin film device 30 is bonded to the supporting substrate with the peeling layer 15 and the temporary fixing adhesive layer 20. The thin film device 30 is composed of a flexible substrate 25, a thin film element layer 35 formed on the flexible substrate 25, and the like. The thin film device 30 is bonded to the flexible substrate 25 with an adhesive layer that is not shown in the figure and will be described later as a permanent adhesive layer 33 in FIG. 4. That is, the thin film device supply body is formed as the stacked structure of the supporting substrate 10, the peeling layer 15, the temporary fixing adhesive layer 20, the flexible substrate 25, the permanent adhesive layer 33, and the thin film element layer 35.

The flexible substrate 25 has flexibility and elasticity as mechanical characteristics. A certain amount of rigidity (strength) is preferably required. With utilization of the flexible substrate 25 that has flexibility, excellent characteristics can be realized that are not obtained from a glass substrate of high rigidity, etc.

Various kinds of synthetic resins are preferably used as materials for the flexible substrate 25. The synthetic resin may be either a thermoplastic resin and a thermosetting resin, examples of which include such as; polyolefins, e.g. polyethylene, polypropylene, ethylene-propylene copolymers, and ethylene-vinyl acetate copolymers (EVAs); cyclic polyolefins; modified polyolefins; polyesters such as polyvinyl chloride, polyvinylidene chloride, polystyrene, polyamides, poly-imides, polyamide-imides, polycarbonates, poly-(4-methylpentene-1), ionomers, acrylic resins, polymethyl methacrylate, acrylic-styrene copolymer (AS resin), butadiene-styrene copolymers, polio copolymers (EVOHs), polyethylene terephthalate (PET), polybutylene terephthalate (PBT), polycyclohexane terephthalate (PCT) and the like; polyethers, polyether-ketones (PEKs), polyether-etherketones (PEEKs), polyether-imides, polyacetals (POMs); polyphenylene oxides; modified polyphenylene oxides; polyalylates; aromatic polyesters (liquid crystal polymers), polytetrafluoroethylene, polyvinylidene fluoride, and other fluorine resins; various thermoplastic elastomers such as styrene-, polyolefin-, polyvinyl chloride-, polyurethane-, fluorine rubber-, chlorinated polyethylene-type, and the like; epoxy resins, phenol resins, urea resins, melamine resins, unsaturated polyesters, silicone resins, polyurethanes, and the like. These can be used alone or in combinations of two or more (such as stacked structure of two or more layers).

Also, the flexible substrate 25 preferably is transparent to light.

The thickness of the flexible substrate 25 can be chosen based on the strength of the flexible substrate 25 and the permanent adhesive layer 33, and the thickness of the thin film element 35. For example, a thickness of approximately from 20 μm to 500 μm is preferable.

Fourth Embodiment

Next, a method of fabricating a thin film device supply body of the present invention will be described with reference to FIGS. 4A through 4E-3.

Figure 4A:
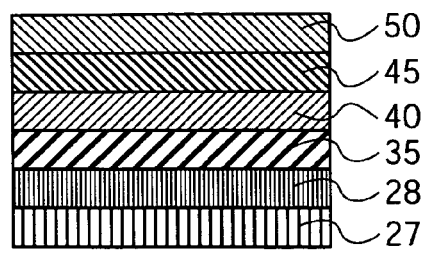
FIG. 4 is a process chart explaining an illustrative configuration of the embodiment.

First, as shown in FIG. 4A, for example, a transparent heat resistant substrate such as quartz glass that withstands at approximately 1000 degrees centigrade serves as an original fabrication substrate 27.

Soda glass, heat resistant glass such as Corning 7059 (product name), Nippon Electric Glass OA-2 (product name), etc., can be used for the original fabrication substrate 27 in addition to quartz glass. Although the thickness of the original fabrication substrate 27 is not greatly limited, a thickness of 0.1 mm to 0.5 mm is preferable, and from 0.5 mm to 1.5 mm is much preferred. If the thickness of the original fabrication substrate 27 is too thin, its strength may decrease. In contrast, if the thickness of the original fabrication substrate 27 is too thick, it causes attenuation of irradiation light in the case where the transmittance rate of the original fabrication substrate is low. However, if the transmittance rate of irradiated light of the original fabrication substrate 27 is high, the thickness of the original fabrication substrate 27 can be increased over the above-mentioned limit value.

A peeling layer 28 is formed on the original fabrication substrate 27. Interface 29 is the interface between the original peeling layer 28 contacting the original substrate 27. The peeling layer 28 can be, for example, formed with an amorphous silicon layer deposited on the original fabrication substrate 27 by means of a CVD method.

The thin film element layer 35 is formed on the peeling layer. The thin film element layer 35 is formed by means of known fabrication processes of thin film semiconductor devices such as deposition of silicon layers, crystallization, patterning, forming of insulation layers, ion implantation, heat treatments, forming of wirings and electrodes, etc.

A first temporary fixing adhesive layer 40 is formed on the thin film element layer 35. Preferred examples of adhesive layer that make up the temporary fixing adhesive layer 40 include various types of adhesives such as a reactive curing type adhesive, thermosetting adhesive, light curing adhesive such as ultraviolet curing adhesive, an anaerobic curing adhesive, etc. Adhesives of any kind may be eligible: epoxy, acrylate, and silicone are illustrative examples. Also, such as an adhesive sheet may be used for the temporary fixing adhesive layer 40.

In addition, the adhesive strength of the temporary fixing adhesive layer 40 is preferably significantly diminished or lost by light irradiation or heating. In a case where a dissolvable adhesive is used for the temporary fixing adhesive layer 40, it is preferable that only the temporary fixing adhesive layer 40 can be dissolved by soaking in water. If a water-soluble adhesive is used, only the temporary fixing adhesive layer 40 can be dissolved by soaking in water.

Next, a temporary fixing substrate 50 on the surface of which a peeling layer 45 is formed is bonded on the above-mentioned temporary fixing adhesive layer 40. The temporary fixing substrate 50 is the substrate made of glass etc., that is the same kind of material as that of the supporting substrate 10. The peeling layer 45 is formed on the temporary fixing substrate 50 in a separate process same as the peeling layer 15 that is not shown.

Figure 4B:
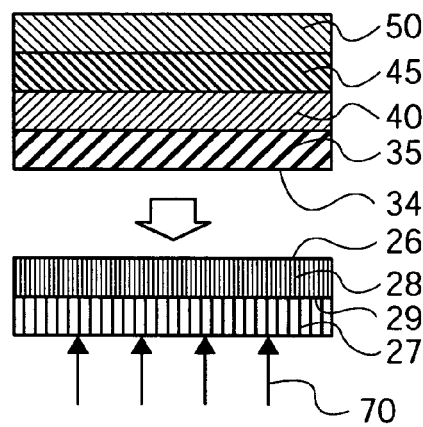

Next, as shown in FIG. 4B, a separation occurs between the peeling layer 28 and the thin film element layer 35 with a light irradiation 70 from the original fabrication substrate 27 side. In the example shown in the figure, the separation occurs between an interface 26 of the peeling layer 28 and an interface 34 of the thin film element 35. A protective layer can be formed on a base of the thin film element layer 35 in advance.

Figure 4C:
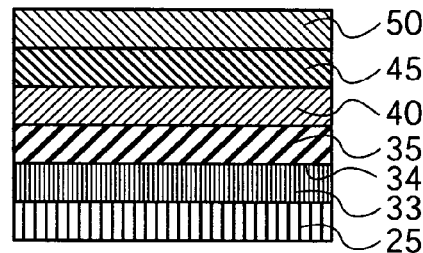

As shown in FIG. 4C, the permanent adhesive layer 33 is applied to a peeling face 34 of the thin film element layer 35 to adhere the flexible substrate 25.

Figure 4D:
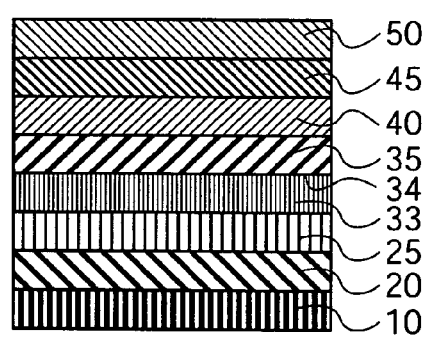

Then, as shown in FIG. 4D, the second temporary fixing adhesive layer 20 is applied to the flexible substrate 25 to bond the supporting substrate 10. The peeling layer 15 (refer to FIG. 3) can be formed on the supporting substrate 10 in advance.

In this way, an intermediate construction body is obtained in which the temporary fixing adhesive layer 20, the flexible substrate 25, the permanent adhesive layer 33, the thin film element layer 35, the temporary fixing adhesive layer 40, the peeling layer 45 and the temporary fixing substrate 50 are formed on the supporting substrate 10 as multiple layers. Here, the part of the supporting substrate 10 through the thin film element layer 35 in the intermediate construction body corresponds the thin film device supply body shown in FIGS. 1, 2, and 3.

Figures 1, 4E:
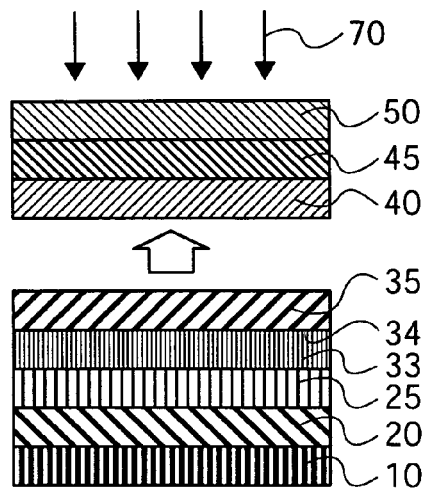
Figures 2, 4E:
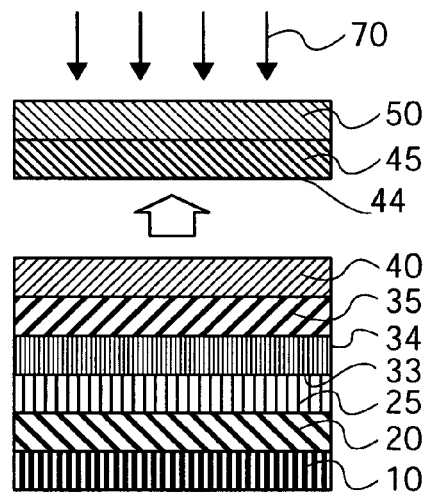
Figures 3, 4E:
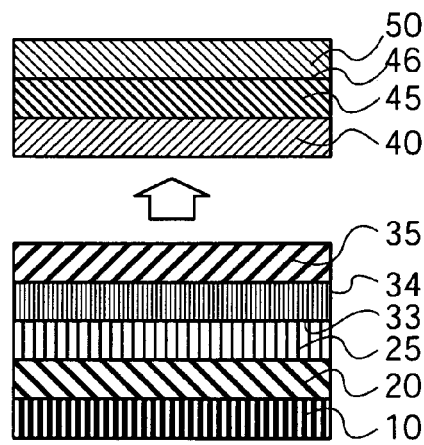

Then, the thin film device supply body is detached from the intermediate construction body. FIGS. 4E-1 through 4E-3 show each aspect of the detaching.

FIG. 4E-1 shows the first detaching aspect. In the example, the irradiation light 70 that has high energy such as laser, etc., is applied to the temporary fixing adhesive layer 40 from the above of the temporary fixing substrate 50. This minimizes or eliminates the bonding force of the temporary fixing adhesive layer 40 so that the thin film device supply body composed of the supporting substrate 10 through the thin film element layer 35 is detached from the intermediate construction body, whereby the thin film device supply body is obtained.

FIG. 4E-2 shows the second detaching aspect. In the example, the irradiation light 70 that has high energy such as laser, etc., is applied to the peeling layer 45 from the above of the temporary fixing substrate 50. This minimizes or eliminates the biding force of the peeling layer 45 so that the thin film device supply body composed of the supporting substrate 10 through the temporary fixing adhesive layer 40 is detached at interface 44 from the intermediate construction body, whereby the thin film device supply body is obtained.

FIG. 4E-3 shows the third detaching aspect. In the example, the temporary fixing adhesive layer 40 is composed of a dissolvable adhesive that is dissolved into a solvent, preferably, a water-soluble adhesive. The temporary fixing adhesive layer 40 is removed with the solvent. Accordingly, the thin film device supply body composed of the supporting substrate 10 through the thin film element layer 35 is detached from the intermediate construction body, whereby the thin film device supply body is obtained.

In this way, the thin film device supply body is fabricated. However, the thin film device supply body of the present invention is not limited to ones fabricated by means of the above-mentioned fabrication methods.

Elemental technique in the above-mentioned fabrication processes will be additionally described.

The peeling layers 15, 28 and 45 preferably have characteristics in that they absorb the irradiation light 70, so that a separation occurs at a boundary surface of a neighboring layer or in the peeling layer.

In addition, with the irradiation of the irradiation light 70, gas contained in the peeling layers 15, 28 and 45 may be released. The released gas makes gap at an interface, resulting in shape change of each peeling layer. In this case, the roughness of the peeling layers 15, 28 and 45 after irradiation of the irradiation light 70 can be controlled depending on the number of irradiation of the irradiation light 70 and/or the content of gas element.

Amorphous silicon is an illustrative example of the composition of the peeling layers 15, 28 and 45. As for the gas element, hydrogen is an illustrative example which is described later.

Amorphous silicon can be instantaneously melted by irradiating light that has high energy such as laser, etc., and changed to polysilicon when it is solidified again. Since grain boundaries are formed when amorphous silicon is crystallized, undulations caused by the grain boundaries occur in the peeling layers 15, 28 and 45. If the irradiation light 70 is further repeatedly irradiated to the peeling layers 15, 28 and 45 that have been crystallized, the roughness of the peeling layers 15, 28 and 45 is increased due to the difference of melting and solidification configurations at a grain boundary and in the grain.

In addition, hydrogen may be contained in the amorphous silicon. In this case, the content of hydrogen is preferably 2 at % or more, and more preferably, from 2 to 20 at %. If a certain amount of hydrogen is contained in this way, the hydrogen is released by the irradiation of the irradiation light. The released hydrogen makes a gap at an interface, whereby undulations are formed in the peeling layers 15, 28 and 45. If the irradiation light is further repeatedly irradiated, the contained hydrogen may be gradually released, so that the roughness of interface may be increased. In this case, if the hydrogen is completely released by the irradiation of the number corresponding to the amount of the hydrogen, after that, no change occurs even though the irradiation light is repeatedly irradiated.

In addition, polysilicon can also be an illustrative example of the composition of the peeling layers 15, 28 and 45.

Similarly, the amorphous silicon is instantaneously melted by irradiating light that has high energy such as laser, etc., and changed to the polysilicon when it is solidified again. In this case, since the configurations of melting is different from that of solidification at a grain boundary and in the grain, the roughness of the peeling layers 15, 28 and 45 can be increased by irradiating the irradiation light 70 repeatedly.

Employing polysilicon as the composition of the peeling layers 15, 28 and 45 has an advantage in that the Tmax can be set a temperature of Tth or more. Here, the Tth is the limit temperature at which amorphous silicon is phase transited to polysilicon. That is, process temperature in forming the thin film element layer 35 can be widened.

For example, in a case where a thin film transistor is formed as the thin film element 35, a high temperature process as well as a low temperature process can be used for a forming method.

The thickness of the peeling layers 15, 28, and 45 preferably are thick enough to absorb the irradiation light 70 while it differs depending on the conditions of the composition, layer construction, forming method, etc., of each peeling layer. If the thickness of each peeling layer is too thin, the irradiation light 70 that is transmitted without absorption in each peeling layer may cause damage to the thin film element layer 35. Also, if the thickness of each peeling layer is too thick, light energy is not transmitted to the interface of peeling layer. Thus, no change may occur at the interface even though the irradiation light is irradiated.

For example, the thickness of the peeling layers 15, 28, and 45 is preferably 25 nm or more, from 50 to 200 nm is much preferred if the peeling layers are made of amorphous silicon and the irradiation light is an excimer laser XeCl (wave length is 308 nm).

The peeling layers 15, 28 and 45 may include a shading layer and/or reflection layer for the purpose of preventing the irradiation light 70 from reaching the thin film element 35 after transmitting each peeling layer and affecting the thin film element 35.

Laser light is preferably used as the light source of the irradiation light 70. As for the laser light, lasers of any kind may be eligible as follows: solid lasers such as a ruby laser, a YAG laser, a glass laser, etc.; gas lasers such as a He—Ne laser, a CO2 laser, an excimer laser, etc.; semiconductor lasers in which ZnS, GaAs, GaP, GaAlAs, etc., are used as a light emitting source; and the like. Particularly, excimer lasers, YAG lasers, and CO2 lasers are preferable because they can easily supply a high power and uniform energy density distribution.

In addition, the mode of laser oscillation may be either of continuous oscillation or pulse oscillation. Further, beam shapes of any kind may be used: a line irradiation and spot irradiation are illustrative examples.

Visible light emitted from a halogen lamp, infrared light, ultraviolet light, microwave, etc., may also be used as the light source of the irradiation light 70 corresponding to the compositions and characteristics of the original fabrication substrate 27, the peeling layers 15, 28 and 45, and the thin film element 35.

Fifth Embodiment

Figure 5:
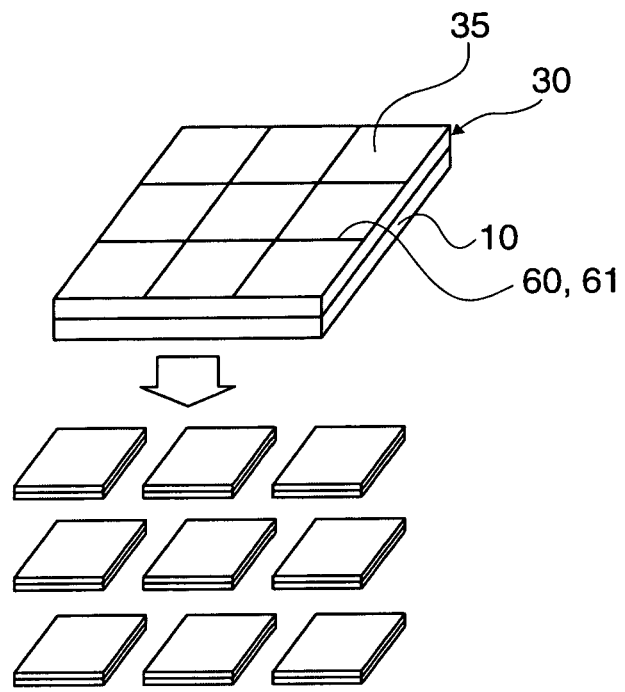
FIG. 5 is a sectional view of an illustrative fabrication process explaining a configuration of the embodiment of the present invention.

FIG. 5 shows another method of fabricating a thin film device supply body according to the embodiment of the present invention. In the fabrication method, in addition to the above-mentioned fabrication processes (refer to FIG. 4), the process is further included in which the thin film device 30 is divided into a plurality of regions while fixing the thin film device 30 to at least one of the supporting substrate 10, the temporary fixing substrate 50, and the original fabrication substrate 27. In FIG. 5, the example is shown in which the thin film device 30 fixed to the supporting substrate 10 is divided. The process that divides the thin film device 30 into the plurality of regions is, for example, conducted including the following processes: the process in which a groove 61 is formed at a boundary 60 of the plurality of regions of the thin film element layer 35 fabricated on the surface of the original fabrication substrate 27; and the process in which the flexible substrate 25 is divided at the boundary of the plurality of regions.

Dividing of the thin film device and handling of the divided thin device are easily conducted by fixing the thin film device 30 to the supporting substrate 10, etc.

Figure 6:
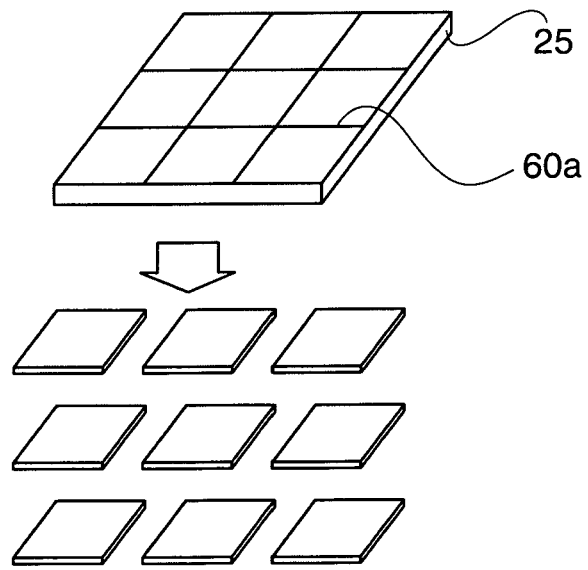
FIG. 6 is a sectional view of an illustrative fabrication process explaining a configuration of the embodiment of the present invention.

FIG. 6 is a diagram further explaining the dividing in the method of fabricating the thin film device supply body. In dividing the flexible substrate 25, the width of a region 60a to be processed of the substrate 25 for dividing the flexible substrate 25 is set smaller than the width of the groove 61 formed at the boundary 60 of the plurality of regions of the thin film element layer 35.

Aspects of the present invention relate to a method of fabricating a thin film device by transferring a thin film element, and particularly, to an advantageous method of fabricating a flexible thin film device that has shape instability in large quantity. Aspects of the present invention are used for fabricating thin film devices in various fields while various kinds of electronic devices are turned to thin film and flexible. Also, the thin film device is used for an electro-optical device and electronic equipment described later.

Sixth Embodiment

A sixth embodiment of the present invention will now be described below referring to the drawings.

In the embodiment, a case where a layer to be transferred is transferred to a final transfer body one time will be described with an example of a method of fabricating a semiconductor device. Here, the final transfer body refers to the transfer body that finally composes the semiconductor device.

FIG. 7 is a diagram explaining an example of a transfer method of the layer to be transferred according to the first embodiment of the present invention.

Figure 7A:
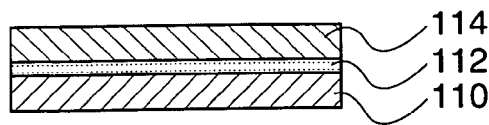
FIG. 7 shows diagrams explaining an illustrative example of a transfer method of a layer to be transferred in a second embodiment of the present invention.

As shown in FIG. 7A, a layer 114 to be transferred is formed on one side of a substrate 110 with a first separating layer 112.

First, the first separating layer 112 is formed on the substrate 110.

The substrate 110 is, for example, preferably made of a material that is capable of transmitting irradiation light 123 used in a later step. Also, when the first separating layer 112 and the layer 114 to be transferred are formed at a temperature of Tmax or less, the substrate 110 is preferably made of a material whose strain point is at Tmax or more.

The first separating layer 112 absorbs irradiation light (the irradiation light 123, for example), and the resulting separation takes place inside and/or at the interface of the layer (hereinafter referred to as "intra-layer separation" or "interfacial separation"). Preferably, when irradiated with light, interatomic or intermolecular bonding force in the components of the first separating layer 112 is lost or diminished, and thereby the resulting ablation causes the intra-layer separation and/or interfacial separation.

Moreover, when irradiated with light, the first separating layer 112 may exhaust gas that causes such separation. That is, components contained in the first separating layer 112 are exhausted in the form of gas, otherwise the first separating layer 112 absorbs light, turning its components to gas for a moment, and then exhausts the gas, and thereby a separation takes place.

As for the first separating layer 112, amorphous silicon (a-Si) is an illustrative example.

The first separating layer 112 may also include a multi-layered film. Such a multilayered film may be composed of, for example, an amorphous silicon film and a metal film of Al, etc., formed thereon. Alternatively, ceramics, metal, organic polymer, and other materials that have the above-mentioned properties can also be used.

A method for forming the first separating layer 112 is not particularly limited, and can be adequately determined depending on various conditions such as film composition, thickness, etc. For example, various vapor-phase film forming methods such as CVD and sputtering, various plating methods, coating methods such as spin coating, various printing methods, transfer methods, inkjet coating, and powder jetting, and a combination of two or more of these methods can be used here.

Depending on the properties of the substrate 110 and the first separating layer 112, an intermediate layer (not shown in FIG. 7A) may be provided between the substrate 110 and the first separating layer 112 for the purpose of improving adhesiveness between the two layers, etc. The intermediate layer functions as at least one of the following: a protective layer that physically or chemically protects the layer to be transferred when it is fabricated or used; insulating layer; barrier layer that prevents the migration of components into or from the layer to be transferred; and reflection layer.

Next, the thin-film device layer (e.g. a thin-film transistor) 114 that serves as the layer to be transferred is formed on the first separating layer 112. As required, a coupling terminal, wiring, or the like required for electrical coupling to an external is provided.

Figure 7B:
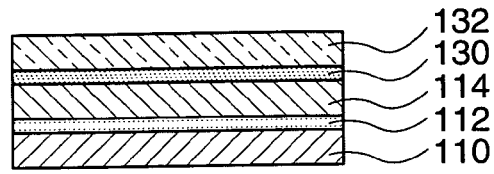

Next, as shown in FIG. 7B, a final transfer body 132 that finally composes a semiconductor device is bonded on the thin-film device 114 with an adhesive layer 130.

The final transfer body 132 used in the present invention is pliable or flexible. The final transfer body 132 may be a substrate, sheet or film. Composed materials are not particularly limited. Resins and glass material may be used as the material that composes the final transfer body 132.

A permanent adhesive is used as the adhesive of an adhesive layer 130. Preferred examples of the adhesive includes reaction curing adhesives, thermosetting adhesives, light curing (e.g. ultraviolet curing) adhesives, and anaerobic curing adhesives. The composition of such adhesives may be any of epoxy, acrylate, and silicone.

Figure 7C:
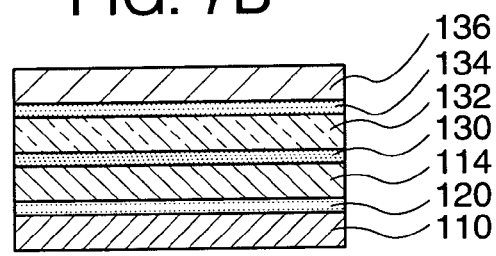

Then, as shown in FIG. 7C, a fixture 136 for reinforcing the strength of the final transfer body 132 is bonded to the final transfer body 132 with a temporary fixing adhesive layer 134.

The fixture 136 is one by which the final transfer body 132 and the substrate 110 are easily detached in a later process. As for the fixture 136, one by which the strength of the final transfer body 132 can be reinforced is not particularly limited to be used. For example, a substrate that is made of glass or a resin, etc., and has rigidity, etc., is used.

In addition, work benches, etc., may be used as the fixture 136. One that is directly fixed to work benches, etc., may be used. Materials to compose the adhesive layer 134 for fixing the fixture 136 are required that can be removed later. Adhesives that turn brittle by specific light, adhesives that dissolves into specific solvents, etc., are an illustrative example of such adhesive. Specifically, for example, water-soluble adhesive of acrylic resins are used.

Here, the fixture 136 is bonded with the adhesive layer 134. However, other methods may be used. Specifically, for example, fixing may be conducted by means of vacuum suctioning.

Figure 7D:
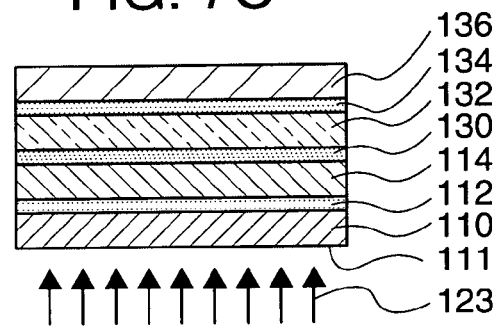

Next, as shown in FIGS. 7C and 7D, the first separating layer 112 is irradiated with light 123 from a back face 111 of the substrate 110 so as to detach the substrate 110 from the layer 114 to be transferred. The first separating layer 112 is irradiated with the irradiation light 123 passing through the substrate 110. Accordingly, the intra-layer separation and/or interfacial separation take place in the first separating layer 112. For a fundamental of the intra-layer separation and/or interfacial separation occur in the first separating layer 112, it is assumed that the separations are caused by an ablation of components of the first separating layer 112, and the exhaust of gas contained in the first separating layer 112, and further phase changes, such as melting and transpiration, etc., that occurs immediately after the irradiation.

Here, "ablation" refers to a phenomenon in which fixing materials (components of the first separating layer 112) that absorb the irradiation light are photochemically or thermally excited, thereby breaking the bonding force between atoms or molecules on the surface of or inside the layer and exhausting them. It is mainly seen as resulting phase changes, such as melting and transpiration (evaporation) of all or part of the components of the first separating layer 112. Moreover, such phase changes form micro bubbles, which may diminish the bonding force.

Examples of the light source of the irradiation light 123 may include X-rays, ultraviolet rays, visible light, infrared rays, laser light, millimeter waves, microwaves, electron beams, and radiation rays. Among others, laser light is preferably used since it is easy to cause ablation with laser light. Examples of such laser light may be any of gas lasers, solid (semiconductor) lasers, etc., and excimer, Nd-YAG, Ar, CO2, CO, He—Ne lasers, etc., are preferably used, and excimer laser is much preferred.

Figure 7E:
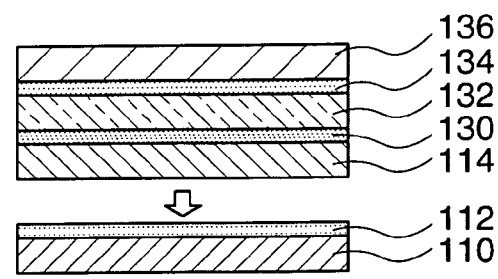

Subsequently, the substrate 110 and the final transfer body 132 are detached as shown in FIG. 7E. For example, the substrate 110 is separated from the final transfer body 132 by applying force on the substrate 110 and the final transfer body 132 for separating the two. Since the strength that bonds the layer 114 to be transferred and the substrate 110 is weakened by the light irradiation, peeling off and transferring are easily conducted here.

While the first separating layer 112 is attached to the substrate 110 as shown in FIG. 7E, a separation may take place inside the first separating layer 112 or between the first separating layer 112 and the substrate 110. In such a case, the first separating layer 112 is attached to the layer 114 to be transferred. Here, the first separating layer 112 attached to the layer 114 to be transferred can be removed by washing, etching, ashing, or other means.

Figure 7F:
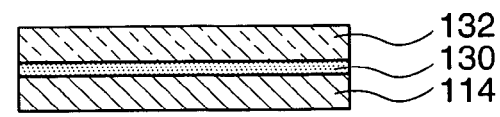

Next, as shown in FIG. 7F, the fixture 136 is removed by removing the adhesive layer 134. If the adhesive layer 134 is made of a water-soluble adhesive, it can be removed by washing in water, etc. In this way, washing off the adhesive layer 134 makes it possible to detach the fixture 136. Accordingly, a semiconductor device can be obtained in which the layer 114 to be transferred is formed on the final transfer body 132 that is pliable or flexible.

In a case where the adhesive layer 134 is made of other material than a water-soluble adhesive, for example, an adhesive that can be dissolved by light irradiation, etc., the adhesive layer 134 can be removed by the irradiation of adequate light.

According to the embodiment, the substrate 110 and the final transfer body 132 can easily be detached as follows. A uniform force can be applied to the substrate 110 and the final transfer body 132 by fixing the final transfer body 132 that has pliability or flexibility with the fixture 136 when the substrate 110 is removed from the final transfer body 132. According to the embodiment, peeling and transferring can easily be conducted by simple means of attaching the fixture 136. This makes it possible to improve productivity and to contribute to reduce costs of the obtained semiconductor device.

In the above-mentioned example, the fixture 136 is attached before the irradiation of light. However, the fixture 136 is attached when the substrate 110 is detached from the final transfer body 132. The order of attaching the fixture 136 is not particularly limited.

Seventh Embodiment

In the embodiment, an example will be described in which a layer to be transferred is temporarily transferred to the first transfer body and then transferred to a final transfer body (the second transfer body) that composes a final product with two transfers.

FIG. 8 and FIG. 9 are diagrams explaining a transfer method of a layer to be transferred in the second embodiment. In FIG. 8 and FIG. 9, elements that are the same as those in FIG. 7 are given the same numerals and the explanation thereof is omitted.

Figure 8A:
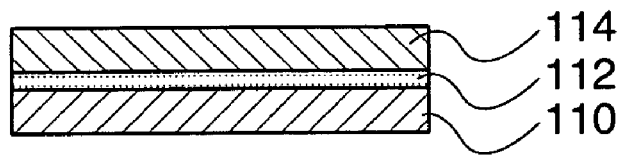
FIG. 8 shows diagrams explaining an illustrative transfer method of a layer to be transferred in a third embodiment of the present invention.
Figure 8B:
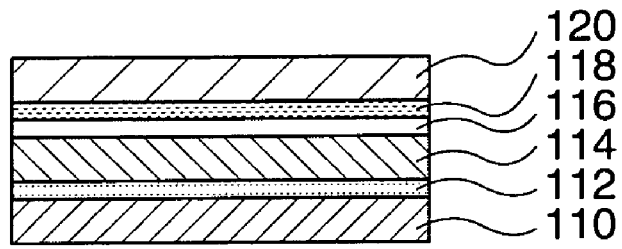

As shown in FIG. 8A, the layer 114 to be transferred is formed on one side of the substrate 110 with the first separating layer 112. As shown in FIG. 8B, a first transfer body 120 is bonded on the layer 114 to be transferred with an adhesive layer 116 and a second separating layer 118. The first transfer body 120 is not particularly limited: a substrate made of glass, a resin, etc., is used. The adhesive layer 116 is used for adhesive bonding of the second separating layer 118 and the layer 114 to be transferred. Also, it is preferable that the adhesive layer 116 can easily be removed when the first transfer body 120 is peeled later. For the adhesive that composes the adhesive layer 116, for example, a water-soluble adhesive of an acrylic resin type is used. In addition, the same thing as that of the first separating layer 112 is used for the second separating layer 118.

Figure 8C:
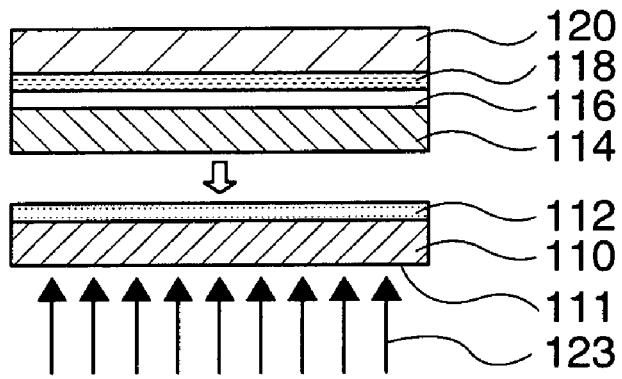

Next, as shown in FIG. 8C, the first separating layer 112 is irradiated with the irradiation light 123 from the back face 111 of the substrate 110, so that the intra-layer separation and/or interfacial separation take place in the first separating layer 112. Subsequently, the substrate 110 is separated from the first transfer body 120 by applying force on the substrate 110 and the first transfer body 120 for separating the two, so that the layer 114 to be transferred is transferred to the first transfer body 120 side.

Figure 8D:
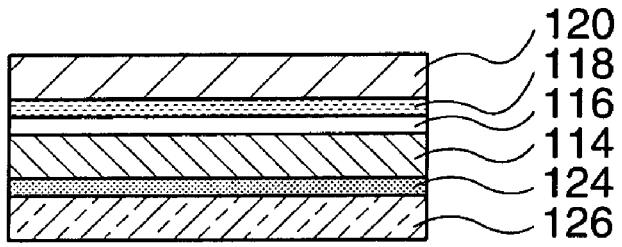

Next, as shown in FIG. 8D, the second transfer body 126 that has pliability or flexibility is bonded to the face from which the substrate 110 has been removed of the layer 114 to be transferred with an adhesive layer 124.

Figure 9A:
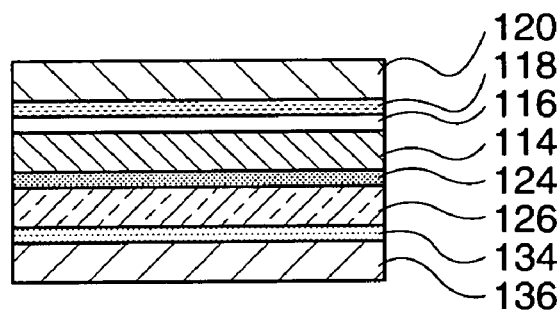
FIG. 9 shows diagrams explaining an illustrative transfer method of a layer to be transferred in the third embodiment of the present invention.

Then, as shown in FIG. 9A, the fixture 136 for reinforcing the strength of the second transfer body 126 is bonded to the second transfer body 126 with the temporary fixing adhesive layer 134.

Figure 9B:
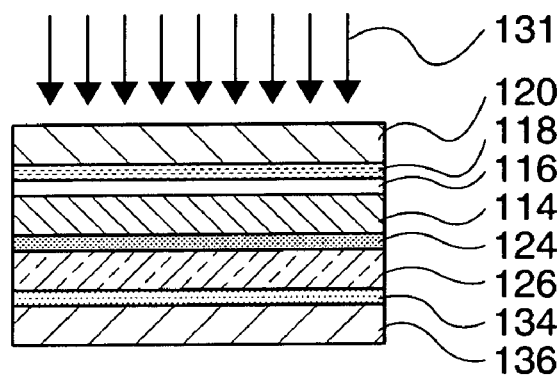
Figure 9C:
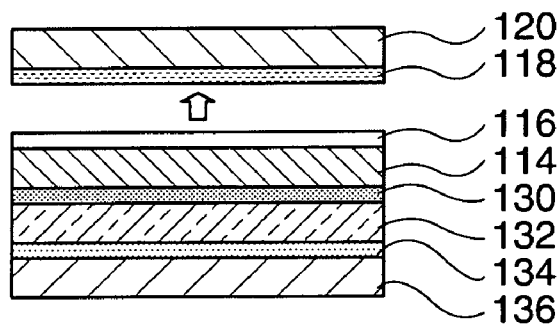

Next, as shown in FIG. 9B and FIG. 9C, the second separating layer 118 is irradiated with irradiation light 131 from the first transfer body 120 side, so that the first transfer body 120 is peeled from the layer 114 to be transferred on which the adhesive layer 116 adheres.

Figure 9D:
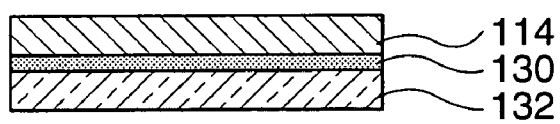

Subsequently, the adhesive layer 116, the adhesive layer 134 and the fixture 136 are removed as shown in FIG. 9D. If the adhesive layers 116 and 134 are made of a water-soluble adhesive, it can be removed by water washing, etc. Also, washing off the adhesive layer 134 makes it possible to remove the fixture 136. Accordingly, a semiconductor device can be obtained.

In a case where the adhesive layers 116 and 134 are made of other material than a water-soluble adhesive, for example, an adhesive that can be dissolved by light irradiation, etc., the adhesive layers 116 and 134 can be removed by the irradiation of adequate light.

In the embodiment in which transfer is conducted to the first transfer body 120 and the second transfer body 132 in two times, also, the detaching can easily be conducted using the fixture 136, because a uniform force can be applied to the first transfer body 120 side and the second transfer body 132 side. Thus, workability is improved. This makes it possible to increase productivity. As a result, costs of a semiconductor device can be reduced.

In the above-mentioned example, the second transfer body 132 is made of a material that has pliability or flexibility. However, the present invention can also be used in a case where both of the first transfer body 120 and the second transfer body 132 are made of a material that has pliability or flexibility. When the first transfer body 120 and the second transfer body 132 both of which has pliability or flexibility are detached, the first transfer body 120 and the second transfer body 132 can easily be separated by attaching the fixture 136 to both of first transfer body 120 and the second transfer body 132.

(Electro-optical Device and Electronic Equipment)

Semiconductor devices fabricated by means of the above-mentioned method are preferably used for electro-optical devices, electronic equipment, etc. Illustrative cases of electro-optical devices and electronic equipment of the present invention will be described referring to FIG. 10 and FIG. 11. FIG. 10 and FIG. 11 are diagrams illustrating examples of various kinds of electronic equipment that includes an electro-optical device 600 (e.g. organic electroluminescence display device).

Figure 10A:
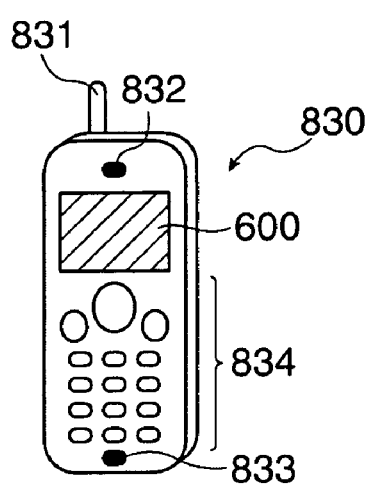
FIG. 10 shows diagrams illustrating illustrative examples of various kinds of electronic equipment that includes an electro-optical device (e.g. organic electroluminescence display device) of the present invention.
Figure 10B:
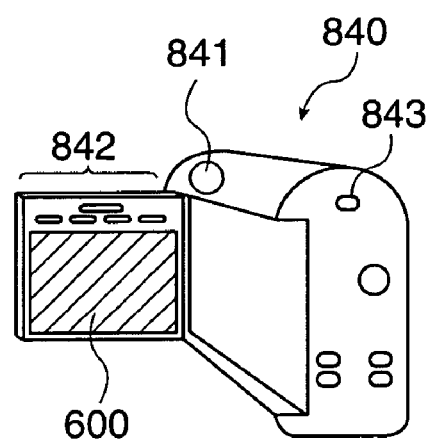
Figure 10C:
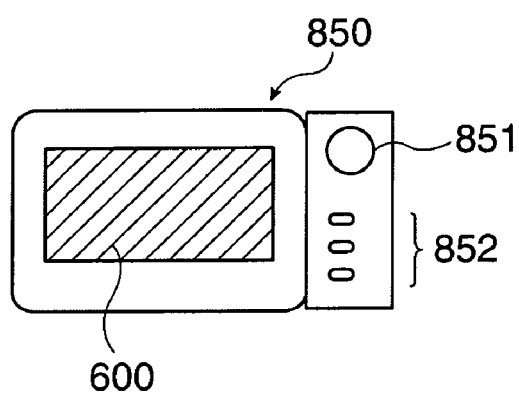
Figure 10D:
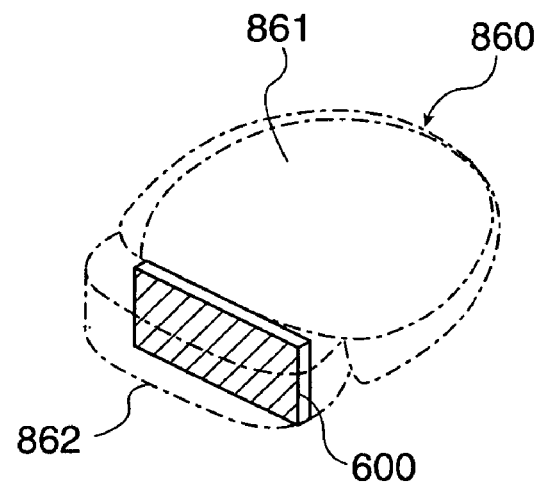
Figure 11A:
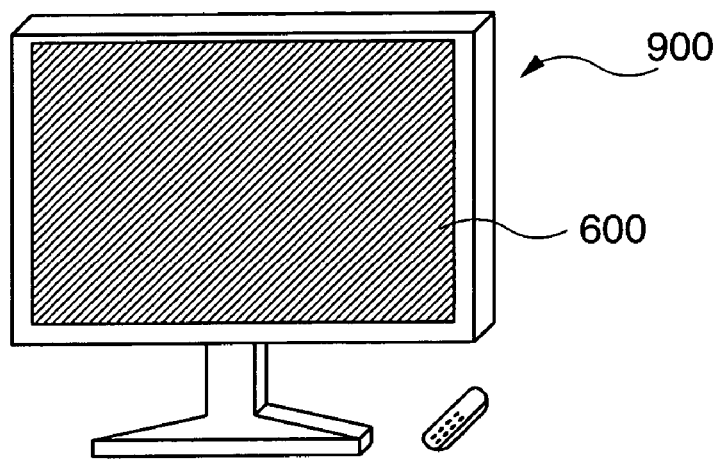
FIG. 11 shows diagrams illustrating illustrative examples of various kinds of electronic equipment that includes an electro-optical device (e.g. organic electroluminescence display device) of the present invention.

FIG. 11A shows a cellular phone as one application example. A cellular phone 830 includes an antenna part 831, a voice output part 832, a voice input part 833, an operating part 834, and the electro-optical device 600 of the present invention. FIG. 10B shows a video camera as another application example. A video camera 840 includes an image reception part 841, an operating part 842, a voice input part 843, and the electro-optical device 600. FIG. 10C shows a mobile personal computer, or a so-called personal digital assistant (PDA), as another application example. A personal computer 850 includes a camera part 851, an operating part 852, and the electro-optical device 600. FIG. 10D shows a head mount display as another application example. A head mount display 860 includes a band 861, an optical system storage part 862, and the electro-optical device 600.

Figure 11B:
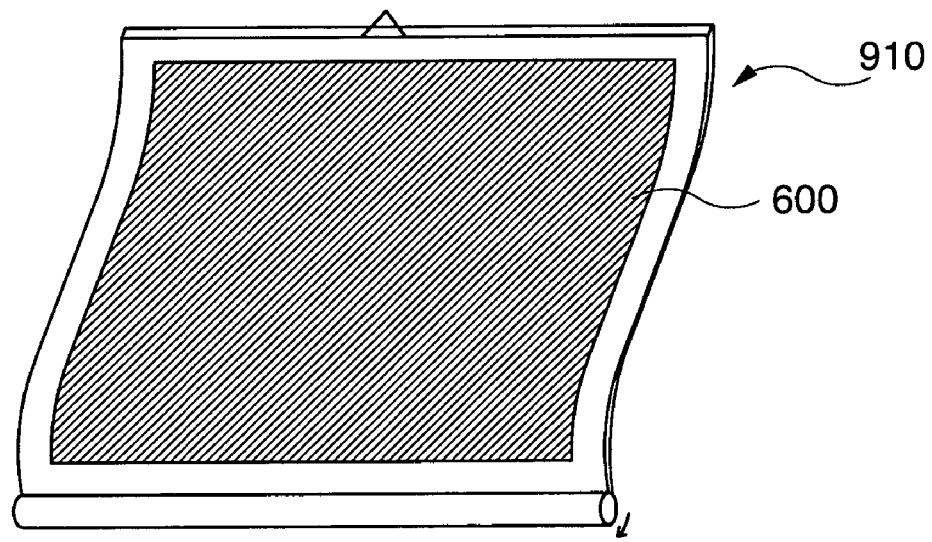

FIG. 11A shows a television as another application example. A television 900 includes the electro-optical device 600. The electro-optical device 600 also can be applied to a monitor display used in a personal computer, etc. FIG. 11B shows a roll-up television as another application example. A roll-up television 910 includes the electro-optical device 600.

In the above-mentioned examples, an organic electroluminescence display device is an illustrative example of one case of electro-optical devices. However, the present invention can be applied to a method of fabricating electro-optical devices that include other various kinds of electro-optical elements (e.g. plasma emissive elements, electrophoretic elements, liquid crystal elements, etc.) in addition to the examples. Also, the scope of the present invention is not limited to an electro-optical device and a method of fabricating the same, can widely applied to various devices formed using peeling and transfer technique. The electro-optical device is not limited to the above-mentioned examples, can be applied to various electro equipment, for example, a fax machine with display function, a digital camera viewfinder, a portable TV, an electronic notebook, etc.

REFERENCE NUMERALS

9: back face of supporting substrate
10: supporting substrate
14: interface of the first peeling layer contacted to the supporting layer
15: first peeling layer
16: interface of first peeling layer contacted to the first temporary fixing adhesive layer
20: first temporary fixing adhesive layer
25: flexible substrate
26: interface of the second peeling layer contacted to thin film element
27: original fabrication substrate
28: second peeling layer
29: interface of the second peeling layer contacted with original fabrication substrate
30: thin film device
33: permanent adhesive layer
34: face from which the original fabrication substrate is removed
35: thin film element
40: second temporary fixing adhesive layer
44: interface of the third peeling layer contacted to the second temporary fixing adhesive layer
45: third peeling layer
46: interface of the third peeling layer contacted with the temporary fixing substrate
50: temporary fixing substrate
60: boundary
61: groove
70: irradiation light
110: substrate
111: back face
112: first separating layer
114: layer to be transferred
116: adhesive layer
118: second separating layer
120: first transfer body
123: irradiation light
124: adhesive layer
126: second transfer body
130: adhesive layer
131: irradiation light
132: final transfer body (second transfer body)
134: adhesive layer
136: fixture
600: electro-optical device
830: cellular phone
831: antenna part
832: voice output part
833: voice input part
834: operating part
840: video camera
841: image reception part
842: operating part
843: voice input part
850: personal computer
851: camera part
852: operating part
860: head mount display
861: band
862: optical system storage part
900: television
910: roll-up television

We claim:

1. A transfer method, the method comprising:
   forming a first separating layer on a substrate;
   forming a layer to be transferred on the first separating layer;
   bonding the layer to be transferred to a first transfer body through an adhesive layer; and
   transferring the layer to be transferred to the transfer body such that the layer to be transferred is divided into a plurality of portions disposed on the first transfer body.

2. The transfer method according to claim 1, the division of the layer to be transferred into the plurality of portions being carried out by grooves that have been formed in the layer to be transferred.

3. The transfer method according to claim 1, the first transfer body being flexible.

4. The transfer method according to claim 1, the first transfer body having a fixture.

5. The transfer method according to claim 1, wherein the grooves formed on the first transfer body are formed such that the first transfer body is divided at the boundary of the plurality of regions.

6. The transfer method according to claim 2, the grooves formed on the layer to be transferred are formed at a boundary of a plurality of region of a thin film element layer that is included in the layer to be transferred.

7. The transfer method according to claim 1, the first transfer body having pliability or flexibility.

8. The transfer method according to claim 7, the first transfer body attached to a fixture.

9. The transfer method according to claim 8, wherein the fixture is an auxiliary substrate.

10. A method of fabricating a semiconductor device using the transfer method according to claim 1.

11. An electronic equipment comprising the semiconductor device fabricated using the method according to claim 10.

12. A transfer method comprising:
   forming a first separating layer on a substrate;
   forming a layer to be transferred on the first separating layer;
   bonding the layer to be transferred to a first transfer body through an adhesive layer formed;

transferring the layer to be transferred to the first transfer body such that the layer to be transferred is divided into a plurality of portions disposed on the first transfer body;

bonding the layer to be transferred to a second transfer body;

transferring the layer to be transferred to the second transfer body.

13. The transfer method according to claim 12, the division of the layer to be transferred into the plurality of portions being carried out by grooves that have been formed in the layer to be transferred.

14. The transfer method according to claim 12, the second transfer body being flexible.

15. The transfer method according to claim 12, the second transfer body having a fixture.

16. The transfer method according to claim 12, the grooves formed in the layer to be transferred are formed at boundaries of a plurality of region of a thin film element layer that is included in the layer to be transferred.

17. The transfer method according to claim 12, the second transfer body having pliability or flexibility.

18. The transfer method according to claim 17, the first body fixed on a fixture.

19. The transfer method according to claim 18, wherein the fixture is an auxiliary substrate.

20. A method of fabricating a semiconductor device using the transfer method according to claim 12.

21. An electronic equipment comprising the semiconductor device fabricated using the method according to claim 20.

* * * * *